United States Patent [19]

Sutton

[11] Patent Number: 4,536,683
[45] Date of Patent: Aug. 20, 1985

[54] HORIZONTAL PHASE SHIFTER

[75] Inventor: Leroy A. Sutton, Wheeling, Ill.

[73] Assignee: Zenith Electronics Corporation, Glenview, Ill.

[21] Appl. No.: 507,704

[22] Filed: Jun. 23, 1983

[51] Int. Cl.³ .......................... H01J 29/70; H01J 29/76
[52] U.S. Cl. ..................................... 315/401; 315/370
[58] Field of Search ............... 315/387, 388, 389, 408, 315/401, 370, 371

[56] References Cited

U.S. PATENT DOCUMENTS 3,979,640  9/1976  Fischman et al. .................. 315/387
4,028,588  6/1977  Kraus .................................. 315/387
4,063,133  12/1977 Nero et al. ........................... 315/387

Primary Examiner—Theodore M. Blum

[57] ABSTRACT

A horizontal deflection circuit for a CRT display includes a horizontal output transistor having an emitter-base junction presenting a resistance which varies as a function of temperature, a transformer having a 5 to 1 turns ratio coupling the emitter-base junction to a horizontal driver transistor which is driven by a horizontal oscillator transistor. A synchronizing signal controls initiation of the horizontal oscillator transistor. A feedback resistor is connected in the transformer primary circuit and supplies signal to a peak detector which develops a DC potential for varying the delay of the synchronizing signal to compensate for temperature change in the emitter-base junction which would otherwise horizontally displace the display on the CRT screen.

6 Claims, 1 Drawing Figure

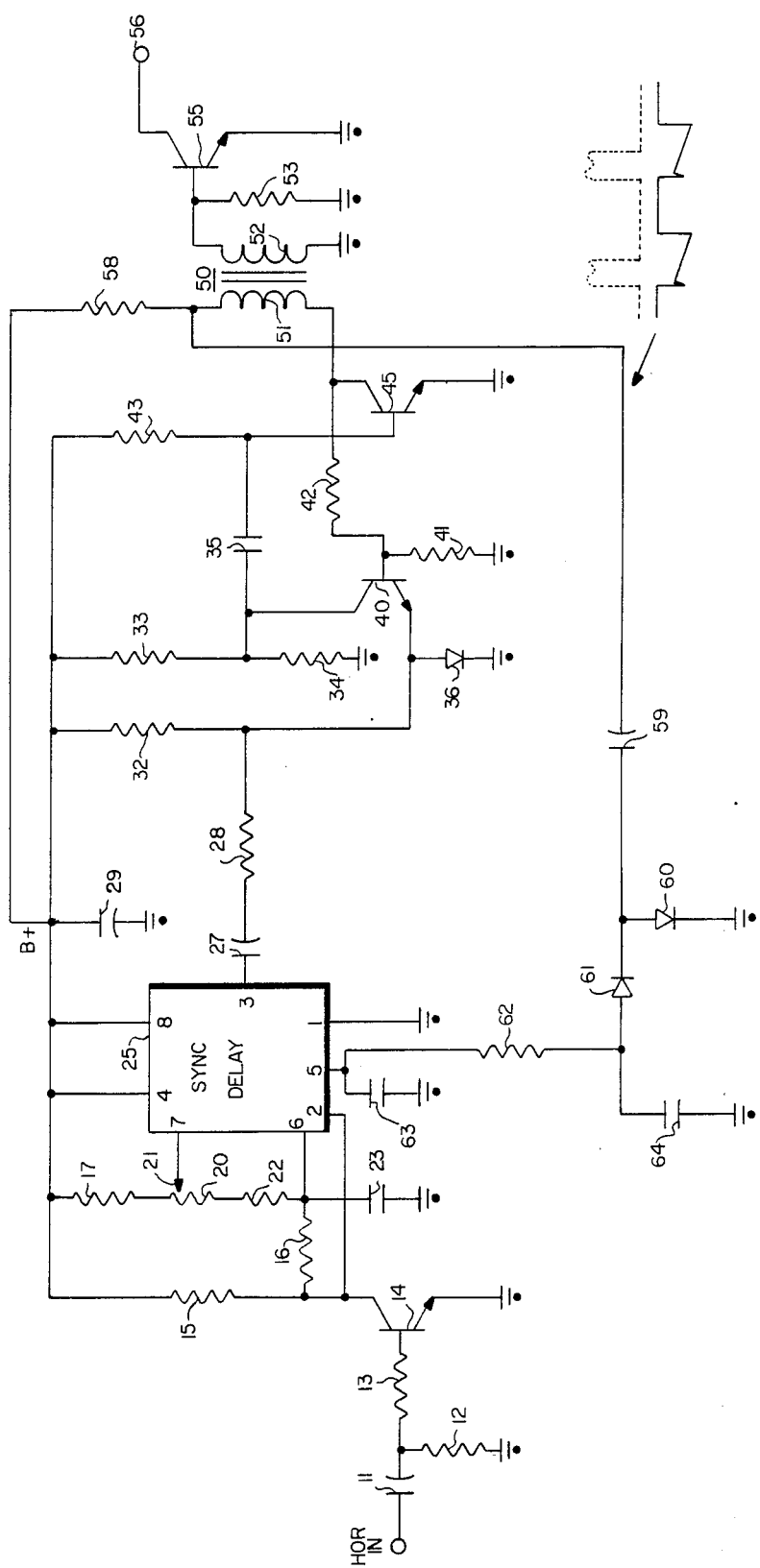

HORIZONTAL PHASE SHIFTER

BACKGROUND OF THE INVENTION AND PRIOR ART

This invention relates generally to deflection control systems and specifically to a temperature stabilized horizontal deflection control system.

Deflection control systems for cathode ray tube (CRT) displays are well known in the art. It is quite common in color television receivers for example to use horizontal deflection control systems that are of the so-called closed loop type. Generally, a phase-locked or voltage controlled oscillator is used to maintain the phase and frequency of the horizontal deflection system within precisely defined limits. In computer monitor applications and in small screen monochrome television receivers, open loop type deflection control systems are used because of their simplicity and low cost and because the deflection drive requirements in small screen applications are much less exacting. The lower drive results in a cooler operating base-emitter junction for the horizontal output transistor. The result is that few if any problems are encountered from delays in switching, at least for operation under normal ambient temperature conditions. In certain applications, however, there is a special need for very close control of the position of the display on the CRT face. This is true with computer display terminals incorporating touch-activated CRT display panels. In such systems very close tolerances must be maintained on the horizontal deflection system to insure that the display is properly positioned on the CRT screen in correct alignment with the touch panel.

Also, for CRT displays intended for vehicular use in environments experiencing a very wide range of temperatures, simple low cost, open loop deflection systems may not be satisfactory. Specifically, the horizontal output transistor delay may be several microseconds corresponding to a base-emitter junction voltage change of as much as 0.2 volts over the approximately 100° C. temperature range encountered. As the base-emitter junction temperature rises, transistor switching becomes slower or more sluggish. Thus, an uncorrectable switching delay, responsive to the horizontal output transistor base-emitter junction temperature, occurs with the result that the display is horizontally displaced on the CRT screen. This is an undesirable condition.

OBJECTS OF THE INVENTION

Accordingly, the principal object of the invention is to provide an improved horizontal deflection circuit.

Another object of the invention is to provide an improved low cost, temperature stabilized horizontal deflection circuit.

SUMMARY OF THE INVENTION

In accordance with the invention a deflection circuit includes an output stage, oscillation means driving the output stage, synchronizing means having an adjustable delay characteristic for controlling the timing of the oscillation means, means developing a signal responsive to the switching time characterizing the output stage and feedback means coupling the developed signal for adjusting the synchronizing means so as to compensate for changes in the switching time of the output stage.

DESCRIPTION OF THE DRAWING

Further objects and advantages of the invention will be apparent upon reading the following description thereof in conjunction with the drawing, the single figure of which is a partial schematic diagram of a deflection circuit constructed in accordance with the invention.

DESCRIPTION OF THE PREFERRED EMBODIMENT

With reference to the drawing, a horizontal input signal is applied to a terminal 10 and through a capacitor 11 to the junction of a pair of resistors 12 and 13. The other end of resistor 12 is connected to ground and the other end of resistor 13 is connected to the base of a horizontal amplifier transistor 14. The horizontal input signal may be derived from a conventional television signal or it may be any type of suitable signal for controlling the display of video information on the face of a cathode ray tube. Horizontal amplifier transistor 14 includes a collector load resistor 15 connected to a B+ line operating at approximately a 10 volt DC potential. Connected in a parallel path with collector resistor 15 is a series circuit including a resistor 17, a potentiometer 20, a resistor 22 and a resistor 16. The junction of resistors 16 and 22 is connected to a capacitor 23, which is returned to ground for signal bypass purposes, and to a pin 6 of a sync delay circuit 25. Sync delay circuit 25 is an integrated circuit chip commercially available in the form of a 555 timer. The numbers indicated on sync delay 25 correspond to the actual terminal pin numbers on the integrated circuit chip. The slider 21 of potentiometer 20, which allows for manual adjustment of the delay characterizing sync delay circuit 25, is connected to pin 7, the collector of transistor 14 is connected to pin 2, B+ is connected to pins 4 and 8 and pin 1 is connected to ground.

B+ is also connected to one side of a filter capacitor 29, the other terminal of which is grounded. Pin 3 of sync delay circuit 25 is connected to a capacitor 27, which in turn is connected through a resistor 28 to the junction of a resistor 32 and the anode of a diode 36. The other end of resistor 32 is connected to B+ and the cathode of diode 36 is connected to ground. A horizontal oscillator transistor 40 has its emitter connected to the junction of resistor 32 and diode 36 and its collector connected to the junction of a pair of resistors 33 and 34 connected between B+ and ground. The base of transistor 40 is connected to ground through a resistor 41 and to the collector of a horizontal driver transistor 45 through a resistor 42. The emitter of horizontal driver transistor 45 is connected to ground and its base is connected to B+ through a load resistor 43 and to the collector of horizontal oscillator transistor 40 through a capacitor 35.

The arrangement of oscillator transistor 40 and driver transistor 45 will be recognized by those skilled in the art as a conventional injection locked oscillator in which a sawtooth shaped output signal is taken from the collector of driver transistor 45. The load for driver transistor 45 comprises the primary winding 51 of a transformer 50, which winding is connected to B+ through a voltage sensing resistor 58. Secondary winding 52 of transformer 50 has one terminal connected to ground and its other terminal is connected to the base of a horizontal output transistor 55 and through a resistor 53 to ground. The collector of horizontal output transistor 55 is connected to a output terminal 56 for supplying the horizontal deflection signal to a CRT display system (not shown). The emitter of horizontal output transistor 55 is connected to ground.

The junction of sensing resistor 58 and primary winding 51 is connected through a capacitor 59 to the anode-cathode junction of a pair of diodes 60 and 61 and thence to the junction of a current limiting resistor 62 and a capacitor 64. This arrangement functions as a peak detector as will be discussed below, the output of the peak detector being a DC voltage that is supplied to pin 5 of sync delay circuit 25. A capacitor 63 bypasses pin 5 to ground. The delay characterizing sync delay circuit 25 varies as a function of the DC voltage applied to pin 5, as well as a function of the manual setting of potentiometer 20.

In operation, the horizontal input signal is amplified in horizontal amplifier transistor 14 and supplied to sync delay circuit 25, the nominal delay thereof being established by the setting of potentiometer 20 to selectively fix the horizontal position of the video display on the CRT screen. The delayed signal output of sync delay 25 is supplied to the injection locked horizontal oscillator transistor 40 in a conventional manner. The injection locked horizontal oscillator and driver circuits are well known in the art, as are the circuits including the transformer and horizontal output transistor.

In accordance with the invention, resistor 58 is included to sense changes in current in primary winding 51. Signals representative of changes in current are "peak detected" by diodes 60 and 61 and capacitors 59 and 64 and produce a DC potential which is applied to pin 5 of sync delay circuit 25. The DC potential is representative of changes in load resistance reflected from the secondary winding of transformer 50 to the primary winding.

The base-emitter junction of horizontal output transistor 55 is very sensitive to temperature. In practice the effective resistance of the base-emitter junction is very small, on the order of 2 ohms, whereas the resistance of stabilizing resistor 53, which is connected in parallel with the base-emitter junction, is much higher—on the order of 80 or 90 ohms. Operation in an ambient temperature range of the magnitude described above, may result in an increased transistor delay or switching time of up to several microseconds corresponding to a change in base-emitter junction voltage of as much as 0.2 volts. The junction voltage change is manifested as a load change on the secondary of transformer 50, which load change is reflected to the primary of the transformer multiplied by the transformer turns ratio. Thus, if the turns ratio of the primary winding to the secondary winding is 5 to 1, any voltage change on the secondary side is seen as a "5x" voltage change on the primary side. Thus, the 0.2 base-emitter junction voltage change causes a change in current which converts to a peak-to-peak voltage change of 2.5 to 3.5 volts on the primary side. The voltage is illustrated by the waveform adjacent to the feedback signal lead between resistor 58 and capacitor 59. The dotted line horizontal pulse waveform is indicated for reference purposes only. The AC component when peak detected, produces approximately a −1.5 to −2.5 volt DC change for application to pin 5 of the sync delay circuit. The sync delay circuit in turn compensates for the slower switching horizontal transistor by appropriately changing or adjusting its delay in the opposite direction. The value of resistor 58 is selected to be about 68 ohms to produce the magnitude of feedback voltage indicated.

With the circuit of the invention, the load change effect of the base-emitter junction temperature of the horizontal output transistor is compensated with a simple, low-cost control system. It is recognized that numerous modifications may be made in the described embodiment of the invention by those skilled in the art without departing from the true spirit and scope thereof. The invention is to be limited only as defined in the claims.

What is claimed is:

1. A horizontal deflection circuit for use with a cathode ray tube display comprising:
    an output stage including a transistor having a base-emitter junction;
    oscillation means including a horizontal oscillator transistor and a horizontal driver transistor;
    a transformer having a primary winding coupled to said horizontal driver transistor and a secondary winding coupled to said horizontal output transistor, said transformer having a primary to secondary turns ratio greater than unity;
    synchronizing means including a delay circuit generating a synchronizing signal for controlling initiation of said horizontal oscillator;
    sensing means in circuit with said primary winding for developing a voltage representative of the load reflected back to said primary winding by the emitter-base junction resistance of said horizontal output transistor; and
    peak detector means coupled to said sensing means for supplying a DC control potential to said delay circuit for controlling the phase of said synchronizing signal.

2. The deflection circuit of claim 1 wherein said transformer has a turns ratio of approximately 5 to 1 for amplifying the effect of temperature-induced changes in the resistance of said emitter-base junction.

3. A horizontal deflection circuit comprising:
    a horizontal output stage including a switching transistor having an emitter-base junction;
    injection locked oscillator means including a transformer having a primary winding coupled to an output driver transistor in said injection locked oscillator means and a secondary winding coupled across said emitter-base junction;
    variable phase synchronizing means including a delay circuit for adjusting the phase thereof for controlling timing of said injection locked oscillator means;
    sensing means for developing a signal representative of the temperature of said emitter-base junction of said switching transistor; and
    feedback means coupled to the primary winding of said transformer for coupling said signal from said sensing means to said variable phase synchronizing means for varying the delay of said delay circuit to compensate for changes in switching time of said switching transistor caused by changes in the temperature of said emitter-base junction.

4. The deflection circuit of claim 3 wherein said sensing means comprise a resistor connected to the primary winding of said transformer and a peak detector for producing a DC voltage related to the temperature of said base-emitter junction for application to said delay circuit.

5. The deflection circuit of claim 3 wherein the turns ratio of said transformer is greater than unity.

6. The deflection circuit of claim 5 wherein said turns ratio is on the order of five to one.

* * * * *